US012690229B2

(12) United States Patent
Imam et al.

(10) Patent No.: US 12,690,229 B2
(45) Date of Patent: Jul. 21, 2026

(54) SEMICONDUCTOR DEVICE WITH SPLIT-GATE AND METHOD FORMING THE SAME

(71) Applicant: Vanguard International Semiconductor Corporation, Hsinchu (TW)

(72) Inventors: Syed-Sarwar Imam, Hsinchu City (TW); Chia-Hao Lee, Jhubei City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 347 days.

(21) Appl. No.: 17/561,317

(22) Filed: Dec. 23, 2021

(65) Prior Publication Data

US 2023/0207682 A1 Jun. 29, 2023

(51) Int. Cl.
| | |
|---|---|
| *H10D 30/66* | (2025.01) |
| *H10D 30/01* | (2025.01) |
| *H10D 64/27* | (2025.01) |

(52) U.S. Cl.
CPC ....... *H10D 30/668* (2025.01); *H10D 30/0297* (2025.01); *H10D 64/514* (2025.01); *H10D 64/518* (2025.01)

(58) Field of Classification Search
CPC ............... H01L 29/7813; H01L 29/407; H01L 29/66734; H01L 29/4236; H01L 29/42368; H01L 29/42376; H01L 29/0623; H01L 29/7397; H01L 29/41741; H01L 29/42364; H10D 30/668; H10D 30/0297; H10D 64/514; H10D 64/518

USPC .. 257/302, 329, 330, 21.41, 29.133, 29.262; 438/212, 259, 270, 454, 589
See application file for complete search history.

(56) References Cited

U.S. PATENT DOCUMENTS

| | | | |
|---|---|---|---|
| 8,319,278 B1 * | 11/2012 | Zeng ................... | H10D 30/665 257/341 |
| 8,648,412 B1 | 2/2014 | Burke et al. | |
| 8,847,307 B2 * | 9/2014 | Darwish .......... | H01L 29/66734 257/493 |

(Continued)

FOREIGN PATENT DOCUMENTS

TW I731753 B 6/2021

OTHER PUBLICATIONS

Taiwanese Office Action and Search Report for Taiwanese Application No. 111105991, dated Apr. 26, 2023.

*Primary Examiner* — David Chen
(74) *Attorney, Agent, or Firm* — Birch, Stewart, Kolasch & Birch, LLP

(57) ABSTRACT

A semiconductor device, including: a substrate having a first conductive type, an epitaxial layer disposed on the substrate, a doped region disposed in the epitaxial layer, and a gate electrode disposed through the doped region and extending into the epitaxial layer. The epitaxial layer has the first conductive type, and the doped region has a second conductive type different from the first conductive type. The gate electrode includes a first structure having a first dimension, and a second structure above the first structure. The second structure includes a main portion and a protruding portion below the main portion, wherein the main portion has a second dimension larger than the first dimension, and the protruding portion has the first dimension.

11 Claims, 12 Drawing Sheets

(56) References Cited

U.S. PATENT DOCUMENTS

| 2006/0001084 | A1 | | 1/2006 | Kelly et al. | |
|---|---|---|---|---|---|
| 2010/0059797 | A1 | * | 3/2010 | Ngai | H01L 29/66734 |
| | | | | | 257/330 |
| 2011/0318894 | A1 | * | 12/2011 | Kobayashi | H01L 29/66734 |
| | | | | | 438/270 |
| 2013/0069150 | A1 | * | 3/2013 | Matsuoka | H01L 29/66734 |
| | | | | | 438/270 |
| 2016/0064546 | A1 | * | 3/2016 | Zitouni | H01L 29/66666 |
| | | | | | 257/334 |
| 2018/0083110 | A1 | * | 3/2018 | Kobayashi | H01L 29/41 |
| 2020/0273987 | A1 | * | 8/2020 | Zeng | H01L 29/66734 |
| 2021/0083097 | A1 | * | 3/2021 | Gangi | H10D 30/668 |
| 2021/0296456 | A1 | * | 9/2021 | Aida | H01L 29/66727 |
| 2021/0336052 | A1 | * | 10/2021 | Qiao | H01L 29/407 |
| 2022/0157976 | A1 | * | 5/2022 | Konishi | H10D 64/112 |

\* cited by examiner

SEMICONDUCTOR DEVICE WITH SPLIT-GATE AND METHOD FORMING THE SAME

BACKGROUND

Technical Field

The present disclosure is related to a semiconductor device and method forming the same, and in particular it is related to a "split-gate" design and method forming the same.

Description of the Related Art

A conventional metal-oxide semiconductor field effect transistor (MOSFET) is a popular discrete power device. A particular power device—one with a vertically diffused configuration—has a P-N junction structure composed of an N-type drift region and an overlying P-type doped region. The P-N junction structure is mainly used to withstand the voltage applied to the conventional metal-oxide semiconductor field effect transistor. When improving the operation voltage of a metal-oxide semiconductor field effect transistor, a reduced dopant concentration and a thicker N-type drift region is required. The ways to improve the withstood voltage of the P-N junction structure results in an increased on-resistance (Ron) of the conventional metal-oxide semiconductor field effect transistor. The on-resistance of the conventional metal-oxide semiconductor field effect transistor is limited by the dopant concentration and the thickness of the N-type drift region.

The vertically diffused configuration has the advantage of taking up less space in the circuit. However, due to the vertically diffused configuration, the thickness of the N-type drift region may affect the overall performance of the device. Although 5 increasing the thickness of the N-type drift region can improve the operation voltage and thereby enhance the breakdown voltage, doing so may also increase on-resistance, which leads to higher heat and more power loss. In other words, there is a trade-off between the breakdown voltage and the on-resistance. Therefore, it is necessary to propose innovative ways to address the trade-off issue.

SUMMARY

In an embodiment, a semiconductor device, including: a substrate having a first conductive type, an epitaxial layer disposed on the substrate, a doped region disposed in the epitaxial layer, and a gate electrode disposed through the doped region and extending into the epitaxial layer. The epitaxial layer has the first conductive type, and the doped region has a second conductive type different from the first conductive type. The gate electrode includes a first structure having a first dimension, and a second structure above the first structure. The second structure includes a main portion and a protruding portion below the main portion, wherein the main portion has a second dimension larger than the first dimension, and the protruding portion has the first dimension.

In another embodiment, a method forming a semiconductor device, including: providing a substrate and an epitaxial layer on the substrate; forming a doped region in the epitaxial layer; forming a gate trench penetrating the doped region and extending into the epitaxial layer. The gate trench includes a first opening having a first width, and a second opening below the first opening, wherein the second opening has a second width smaller than the first width. The method further includes filling the second opening with a metal material; etching back the metal material into a first structure of a gate electrode, wherein a top surface of the first structure is lower than a top of the second opening; depositing a gate dielectric layer on the top surface of the first structure, wherein the gate dielectric layer is positioned lower than the top of the second opening; and forming a second structure of the gate electrode on the gate dielectric layer and filling a remaining portion of the second opening and the first opening.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
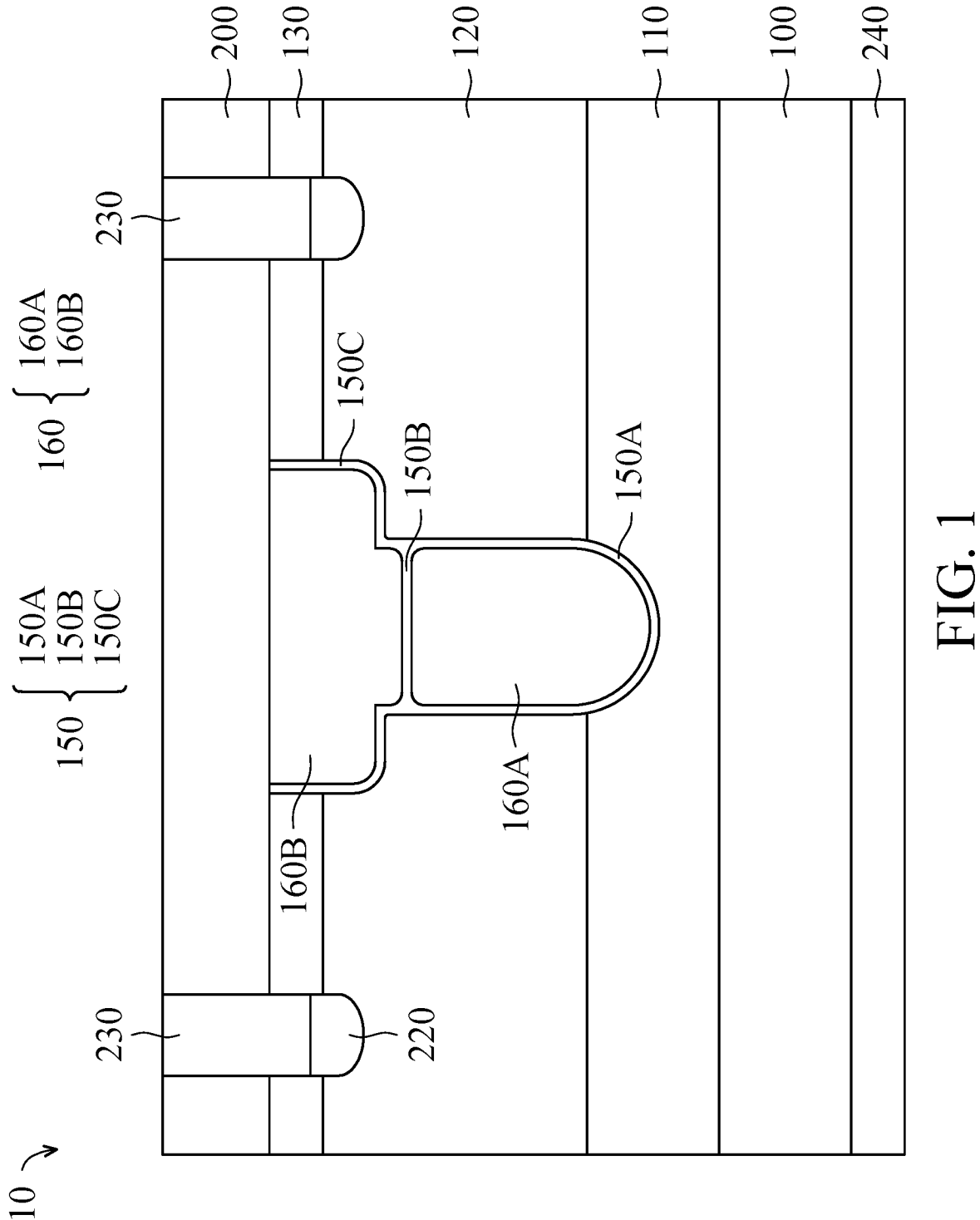
FIG. 1 is a cross-sectional view of a semiconductor device, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper," and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value, and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

A power device, such as a metal-oxide semiconductor field effect transistor (MOSFET), may be extensively used in the power system components of analog circuits and digital circuits. In order to reduce the power loss of the power device, on-resistance must be reduced. From previous experiments, it has been discovered that decreasing the Epi thickness may reduce the undesirable on-resistance. However, beyond a certain extent of the Epi thickness reduction, the breakdown voltage of the power device cannot maintain at an acceptable level. Simply stated, increasing the Epi thickness increases both the breakdown voltage and the on-resistance, while decreasing the Epi thickness decreases both the breakdown voltage and the on-resistance. Adjusting only the Epi thickness cannot enhance the breakdown voltage and suppress the on-resistance simultaneously.

It has been discovered that implementing a "split-gate" structure into the metal-oxide semiconductor field effect transistor can maintain the breakdown voltage and reduce the on-resistance. The arrangement of the "split-gate" structure may drive the electric field toward the drain terminal, which in turn increases the breakdown voltage and decreases the on-resistance. The "split-gate" includes two structures of different dimensions. The structure with larger dimension determines the on-resistance, and the structure with smaller dimension determines the breakdown voltage. More specifically, the present disclosure introduces an innovative protruding portion extending from the structure of larger dimension. The protruding portion has the smaller dimension, which allows for the on-resistance to be further suppressed.

FIG. 1 is a cross-sectional view of a semiconductor device 10, according to some embodiments of the present disclosure. In some embodiments, a semiconductor device of vertical configuration may contain any number of gate structures and source structures alternately arranged, depending on the application and design requirement. For the sake of brevity, FIG. 1 only illustrates one gate structure laterally disposed between a pair of source structures. According to some embodiments of the present disclosure, the semiconductor device 10 includes a substrate 100, an epitaxial layer 110, a doped region 120, a well region 130, a gate dielectric layer 150, a gate electrode 160, an interlayer dielectric (ILD) layer 200, doped contact regions 220, source electrodes 230, and a drain electrode 240. In some embodiments, the gate dielectric layer 150 may include a first portion 150A, a second portion 150B, and a third portion 150C. Moreover, the gate electrode 160 may include a first structure 160A and a second structure 160B.

Referring to FIG. 1, the substrate 100 may be, for example, a wafer or a chip, but the present disclosure is not limited thereto. In some embodiments, the substrate 100 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof.

In other embodiments, the substrate 100 may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate 100 may be a first conductive type or a second conductive type. In the following embodiments, the first conductive type and the second conductive type may represent an N-type and a P-type, respectively. The first conductive type (N-type) and the second conductive type (P-type) may each be doped with appropriate dopants (or impurities). The N-type dopants may include Arsenic while the P-type dopants may include Boron. In a specific embodiment of the present disclosure, the substrate 100 may be the first conductive type (N-type), with a doping concentration approximately between $1 \times 10^{19}$ cm$^{-3}$ and $3 \times 10^{19}$ cm$^{-3}$.

In other embodiments, the substrate 100 may include isolation structures (not shown) to define active regions and to electrically isolate active region elements within or above the substrate 100, but the present disclosure is not limited thereto. The isolation structures may include deep trench isolation (DTI) structures, shallow trench isolation (STI) structures, or local oxidation of silicon (LOCOS) structures. In some embodiments, the formation of the isolation structures may include, for example, forming an insulating layer on the substrate 100, selectively etching the insulating layer and the substrate 100 to form trenches that extend from the top surface of the substrate 100 to a position within the substrate 100, in which the trenches are located between adjacent active regions. Next, the formation of the isolation structures may include growing rich nitrogen-containing (such as silicon oxynitride) liners along the trenches, followed by filling insulating materials (such as silicon dioxide, silicon nitride, or silicon oxynitride) into the trenches with deposition processes. After that, an annealing process is performed on the insulating materials in the trenches, followed by a planarization process on the substrate 100 to remove excessive insulating materials, so the insulating materials in the trenches are level with the top surface of the substrate 100.

Still referring to FIG. 1, the epitaxial layer 110 is provided on the substrate 100. According to some embodiments of the present disclosure, the epitaxial layer 110 has the first conductive type, with a doping concentration approximately between $2.9 \times 10^{14}$ cm$^{-3}$ and $5.0 \times 10^{14}$ cm$^{-3}$. In a specific embodiment of the present disclosure, the substrate 100 has the same conductive type as the epitaxial layer 110, and a dopant concentration of the substrate 100 is larger than that of the epitaxial layer 110. The materials of the epitaxial layer 110 may include arsenic, the like, or combinations thereof. The thickness of the epitaxial layer 110 may be approximately between 4 μm and 8 μm, for example, approximately 6 μm. The epitaxial layer 110 may be formed by epitaxy growth.

Referring to FIG. 1, the doped region 120 may be formed within the epitaxial layer 110, and may be extended from the top surface of the epitaxial layer 110. In some embodiments, the doped region 120 may reduce body resistance, prevent punch-through to the subsequently formed source electrodes 230, and improve unclamped inductive load switching ruggedness. According to some embodiments of the present disclosure, the doped region 120 has the second conductive type (P-type), with a doping concentration approximately between $1\times10^{12}$ cm$^{-3}$ and $5\times10^{12}$ cm$^{-3}$. The thickness of the doped region 120 may be approximately between 0.8 μm and 1.2 μm. The doped region 120 may be formed by, for example, an ion implantation and/or a diffusion process.

Still referring to FIG. 1, the well region 130 may be formed within the doped region 120, and may be extended from the top surface of the doped region 120. In some embodiments, the well region 130 has the first conductive type (N-type). It can be noted that the arrangement of the well region 130 (N-type) within the doped region 120 (P-type) and the doped region 120 within the epitaxial layer 110 (N-type) may constitute a bipolar (NPN) junction. During the device operation, a depletion area may be formed in the bipolar junction to reduce the current leakage and to enhance the breakdown voltage. According to some embodiments of the present disclosure, the well region 130 has a doping concentration approximately between $4\times10^{12}$ cm$^{-3}$ and $7\times10^{12}$ cm$^{-3}$. The thickness of the well region 130 may be approximately between 1.2 μm and 1.8 μm. Formation of the well region 130 may be similar to that of the doped region 120, and the details are not described again herein to avoid repetition.

Referring to FIG. 1, the gate dielectric layer 150 and the gate electrode 160 may be formed through the well region 130 and the doped region 120, and extend into the epitaxial layer 110. As mentioned previously, the gate electrode 160 may include the first structure 160A and the second structure 160B. The second structure 160B is positioned above the first structure 160A. The gate electrode 160 may function as a transistor gate terminal of the semiconductor device 10. In some embodiments, the gate electrode 160 may be insulated from a vertical channel region by the gate dielectric layer 150 (the details of which will be explained later). The materials of the gate electrode 160 may include metals, metal nitride (such as titanium nitride (TiN)), metal oxide (such as titanium oxide (TiO)), other suitable materials, or combinations thereof, but the present disclosure is not limited thereto. Metals may include, but are not limited to, cobalt (Co), ruthenium (Ru), aluminum (Al), tungsten (W), copper (Cu), titanium (Ti), tantalum (Ta), silver (Ag), gold (Au), platinum (Pt), nickel (Ni), zinc (Zn), chromium (Cr), molybdenum (Mo), niobium (Nb), the like, combinations thereof, or multiple layers thereof.

The first structure 160A and the second structure 160B of the gate electrode 160 are "split" by a portion of the gate dielectric layer 150 (or the second portion 150B), demonstrating the "split-gate" feature of the present disclosure. The first structure 160A has a lateral dimension approximately between 3.5 μm and 4.0 μm, and a vertical dimension approximately between 0.6 μm and 0.8 μm. According to some embodiments of the present disclosure, the second structure 160B of the gate electrode 160 further includes a main portion and a protruding portion extended out from the bottom of the main portion. The main portion of the second structure 160B has a lateral dimension approximately between 0.85 μm and 0.95 μm, and a vertical dimension approximately between 1.2 μm and 1.5 μm. The protruding portion of the second structure 160B has the same lateral dimension as that of the first structure 160A, while the vertical dimension of the protruding portion of the second structure 160B may be approximately between 0.15 μm and 0.25 μm, for example, approximately 0.20 μm.

As shown in FIG. 1, the protruding portion of the second structure 160B is vertically located between the first structure 160A and the main portion of the second structure 160B. As stated earlier, the first structure 160A determines the breakdown voltage, while the second structure 160B determines the on-resistance of the semiconductor device 10. Conventional "split-gate" structures do not have the protruding portion, which may serve as a junction between the first structure 160A and the second structure 160B. Even though the conventional "split-gate" feature is able to reduce the on-resistance while maintaining the breakdown voltage, the presence of the protruding portion provides a shrinking dimension behavior on the second structure 160B, which allows for an even further suppression of the on-resistance. It should be appreciated that the vertical dimension of the protruding portion (or the protrusion depth E in FIG. 2K) cannot exceed beyond the designated range (for example, approximately between 0.15 μm and 0.25 μm). If the protrusion depth E (shown in FIG. 2K) is too small, then the electrical characteristics of the semiconductor device 10 may not be significantly enhanced. In contrast, if the protrusion depth E is too large, the second portion 150B of the gate dielectric layer 150 may be consumed.

Still referring to FIG. 1, besides the second portion 150B, the first portion 150A and the third portion 150C of the gate dielectric layer 150 surround the outer periphery of the first structure 160A and the second structure 160B, respectively. More specifically, the first portion 150A of the gate dielectric layer 150 is disposed conformally on opposite sides and the bottom of the first structure 160A. The third portion 150C is disposed conformally on opposite sides of the second structure 160B, and on the exposed bottom surface of the main portion of the second structure 160B. The gate dielectric layer 150 provides insulation between the first structure 160A and the second structure 160B, and between the gate electrode 160 and the doping layers (such as the epitaxial layer 110, the doped region 120, or the well region 130). It should be understood that, during the device operation, the vertical channel region is generated through the well region 130, the doped region 120, and the epitaxial layer 110.

Materials of the gate dielectric layer 150 may include silicon oxide, silicon nitride, or multilayers thereof. In other embodiments, the gate dielectric layer 150 includes materials with a high dielectric constant, and in these embodiments, the gate dielectric layer 150 may have a dielectric constant (or k value) greater than about 7.0, and may include a metal oxide or a silicate of hafnium (Hf), aluminum, zirconium (Zr), lanthanum (La), magnesium (Mg), barium (Ba), titanium, lead (Pb), the like, or combinations thereof. The thickness of the gate dielectric layer 150 may be approximately between 500 Å and 700 Å, for example, approximately 600 Å. According to some embodiments of the present disclosure, the first portion 150A, the second portion 150B, and the third portion 150C may have the same thickness. It should be understood that if the thickness of the gate dielectric layer 150 is too large, excessive capacitance may be generated (especially between the first structure 160A and the second structure 160B). If the thickness of the gate dielectric layer 150 is too small, then the insulation function may be compromised. The gate dielectric layer 150 may be formed by molecular beam deposition (MBD), atomic layer deposition (ALD), plasma-enhanced chemical vapor deposition (PECVD), the like, or combinations thereof.

As shown in FIG. 1, the first structure 160A of the gate electrode 160 and the first portion 150A of the gate dielectric layer 150 are disposed vertically across the doped region 120 and the epitaxial layer 110. The protruding portion of the second structure 160B of the gate electrode 160 and the second portion 150B of the gate dielectric layer 150 are entirely disposed within the doped region 120. The main portion of the second structure 160B of the gate electrode 160 and the third portion 150C of the gate dielectric layer 150 are disposed through the well region 130 and extend into the doped region 120. It should be appreciated that it is necessary for the main portion of the second structure 160B of the gate electrode 160 and the third portion 150C of the gate dielectric layer 150 to extend into the doped region 120, in order to shift the electric field toward the drain terminal, thereby enhancing the breakdown voltage. However, the main portion of the second structure 160B of the gate electrode 160 and the third portion 150C of the gate dielectric layer 150 cannot extend into the epitaxial layer 110, since doing so may result in breakdown failure. Furthermore, the first structure 160A of the gate electrode 160 and the first portion 150A of the gate dielectric layer 150 cannot reach the substrate 100, since doing so may result in operational failure.

Referring to FIG. 1, the interlayer dielectric layer 200 may be formed on the epitaxial layer 110, the gate dielectric layer 150, and the gate electrode 160. More specifically, the interlayer dielectric layer 200 covers the well region 130, the third portion 150C of the gate dielectric layer 150, and the second structure 160B of the gate electrode 160. In some embodiments, the interlayer dielectric layer 200 may provide mechanical protection and insulation for the underlying structures. The materials of the interlayer dielectric layer 200 may include silicon oxide (SiO), silicon nitride (SiN), silicon carbide (SiC), silicon oxynitride (SiON), or silicon carbon oxynitride (such as $SiO_xN_yC_{1-x-y}$, wherein x and y are in the range from 0 to 1), tetraethylorthosilicate (TEOS), undoped silicate glass, or doped silicon oxide (such as boron-doped phosphosilicate glass (BPSG), fused silica glass (FSG), phosphosilicate glass (PSG), boron doped silicon glass (BSG)), low-k dielectric materials, or other suitable dielectric materials. The interlayer dielectric layer 200 may be formed by chemical vapor deposition (CVD), high-density plasma chemical vapor deposition (HDP-CVD), plasma-enhanced chemical vapor deposition, flowable chemical vapor deposition (FCVD), sub-atmospheric chemical vapor deposition (SACVD), the like, or combinations thereof.

Still referring to FIG. 1, the doped contact regions 220 and the source electrodes 230 may be sequentially formed through the interlayer dielectric layer 200 and the well region 130, and extend into the doped region 120. More specifically, the doped contact regions 220 are disposed vertically across the well region 130 and the doped region 120. The source electrodes 230 are disposed through the interlayer dielectric layer 200 and extend into the well region 130. The materials of the doped contact regions 220 may include arsenic, the like, or combinations thereof. According to some embodiments of the present disclosure, the doped contact regions 220 have the second conductive type (P-type), with a doping concentration approximately between $1\times10^{15}$ cm$^{-3}$ and $3\times10^{15}$ cm$^{-3}$. The thickness of the doped contact region 220 may be approximately between 0.6 μm and 0.8 μm."

The source electrodes 230 may function as a transistor source terminal of the semiconductor device 10. The materials of the source electrodes 230 may be similar to those of the gate electrode 160, and the details are not described again herein to avoid repetition. The thickness of the source electrodes 230 may be approximately between 0.35 μm and 0.55 μm. The doped contact regions 220 and the source electrodes 230 may be formed by chemical vapor deposition, physical vapor deposition (PVD), atomic layer deposition, the like, or combinations thereof. After forming the doped contact regions 220 and before forming the source electrode 230, the doped contact regions 220 may be doped using the ion implantation and/or the diffusion process.

Referring to FIG. 1, the drain electrode 240 may be formed on the backside of the substrate 100, or the surface opposite the epitaxial layer 110 (which is disposed on the frontside of the substrate 100). More specifically, the drain electrode 240 covers the backside of the substrate 100. The drain electrode 240 may function as a transistor drain terminal of the semiconductor device 10. It should be appreciated that the source electrodes 230 and the drain electrode 240 defines the aforementioned vertical channel region generated during the device operation. The materials of the drain electrode 240 may be similar to those of the gate electrode 160 or the source electrodes 230, and the details are not described again herein to avoid repetition. The thickness of the drain electrode 240 may be approximately between 10 μm and 20 μm. The drain electrode 240 may be formed by back metallization, which utilizes similar methods to those of the source electrodes 230, and the details are not described again herein to avoid repetition.

FIGS. 2A-2K are various cross-sectional views of intermediate stages in manufacturing the semiconductor device 10, according to some embodiments of the present disclosure. It should be noted that the step-by-step procedures in FIGS. 2A-2K are for illustration purpose only, and are not intended to be limiting. For example, various steps as shown in FIGS. 2A-2K may be added, removed, replaced, rearranged, and repeated.

Figure 2A:
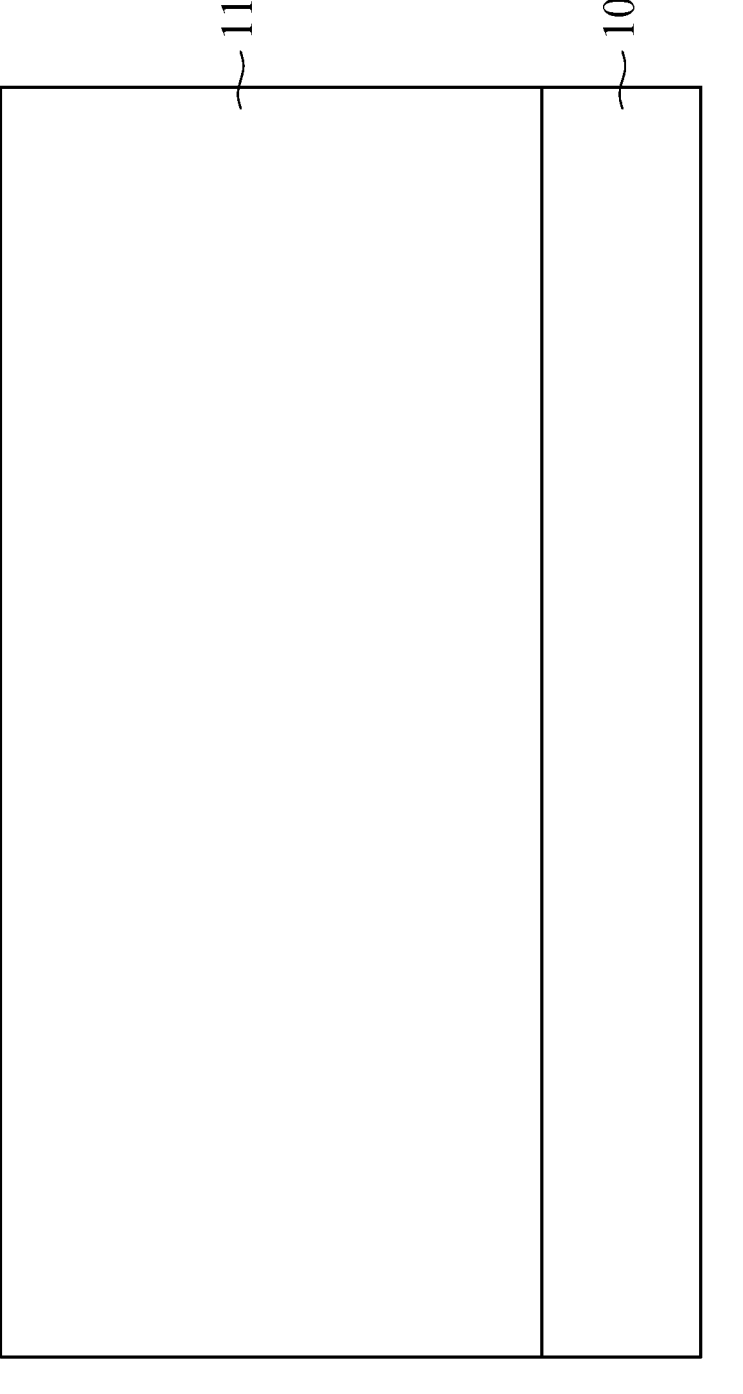
FIGS. 2A-2K are various cross-sectional views of intermediate stages in manufacturing the semiconductor device, according to some embodiments of the present disclosure.

Referring to FIG. 2A, the substrate 100 and the epitaxial layer 110 are provided. As mentioned previously, the epitaxial layer 110 may be formed on the substrate 100 by epitaxy growth, which may include metal organic chemical vapor deposition (MOCVD), molecular beam epitaxy (MBE), liquid phase epitaxy (LPE), vapor phase epitaxy (VPE), selective epitaxial growth (SEG), the like, or combinations thereof. The substrate 100 and the epitaxial layer 110 both have the first conductive type (N-type).

Figure 2B:
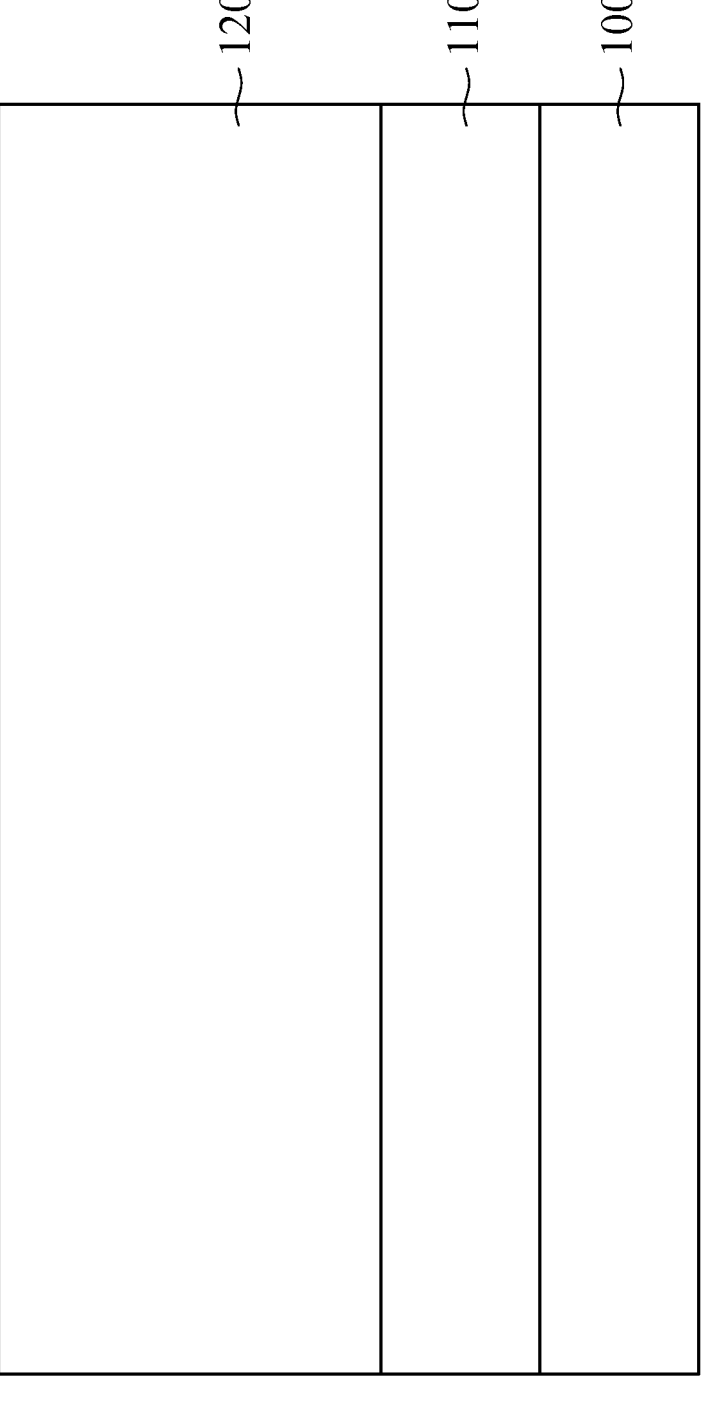

Referring to FIG. 2B, the doped region 120 may be formed within the epitaxial layer 110. In alternative embodiments, instead of using the ion implantation and/or the diffusion process (as mentioned), the doped region 120 may be in situ doped during the growth of the epitaxial layer 110. In yet other embodiments, in situ and implantation doping may be implemented together. The doped region 120 has the second conductive type (P-type), which is different from that of the substrate 100 or the epitaxial layer 110.

Figure 2C:
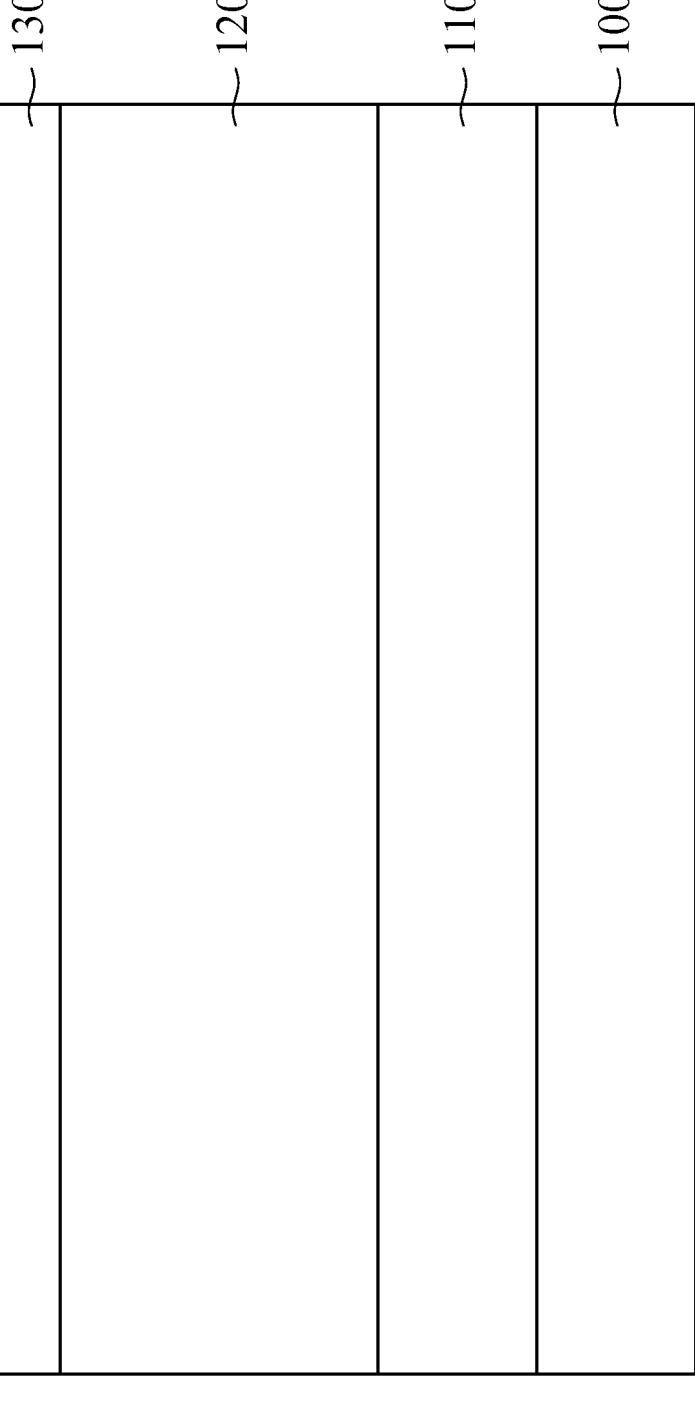

Referring to FIG. 2C, the well region 130 may be formed within the doped region 120, which is formed within the epitaxial layer 110. The well region 130 has the first conductive type (N-type). As mentioned previously, the arrangement of the epitaxial layer 110, the doped region 120, and the well region 130 constitute a bipolar junction to reduce the current leakage and to enhance the breakdown voltage during the device operation.

Figure 2D:
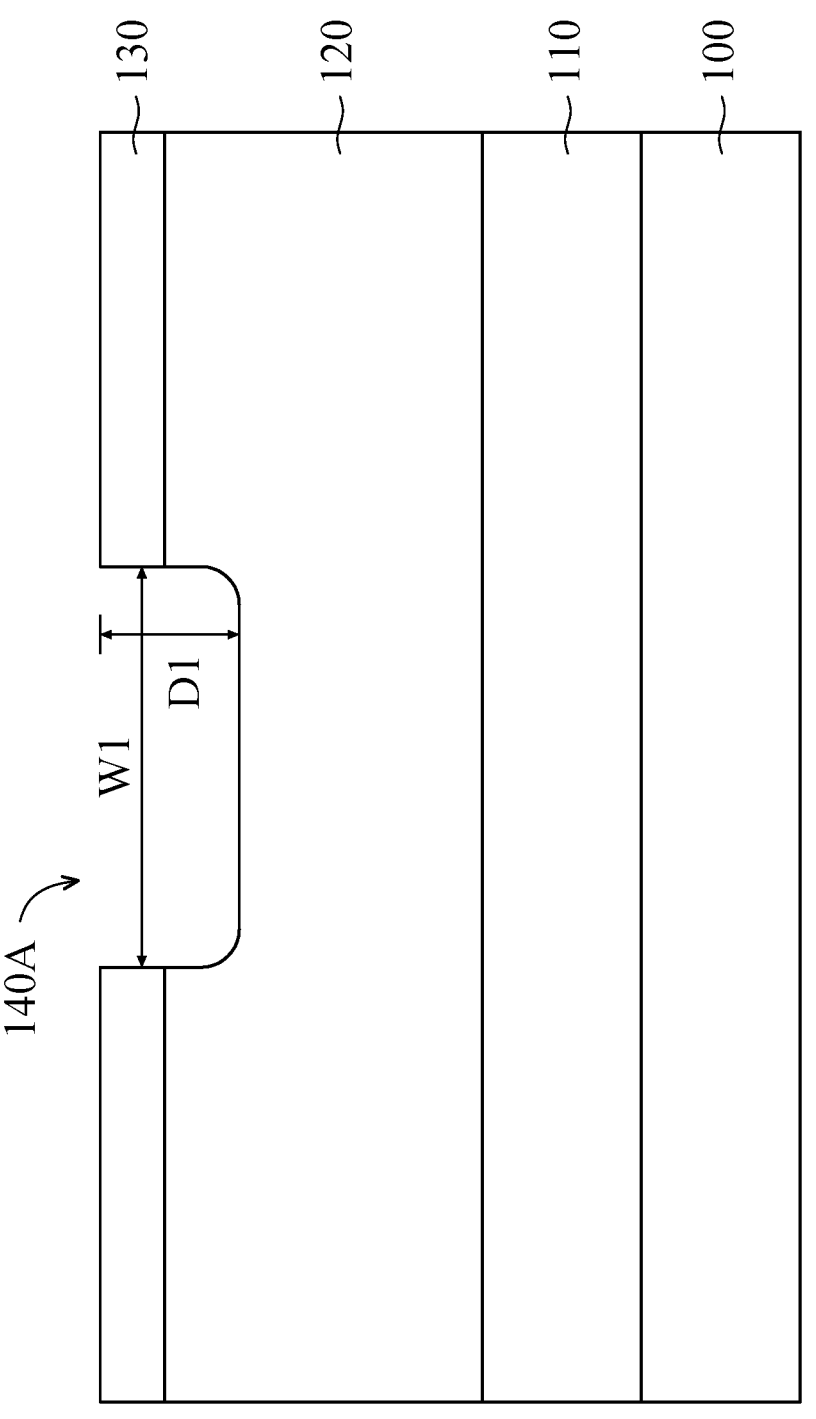
Figure 2E:
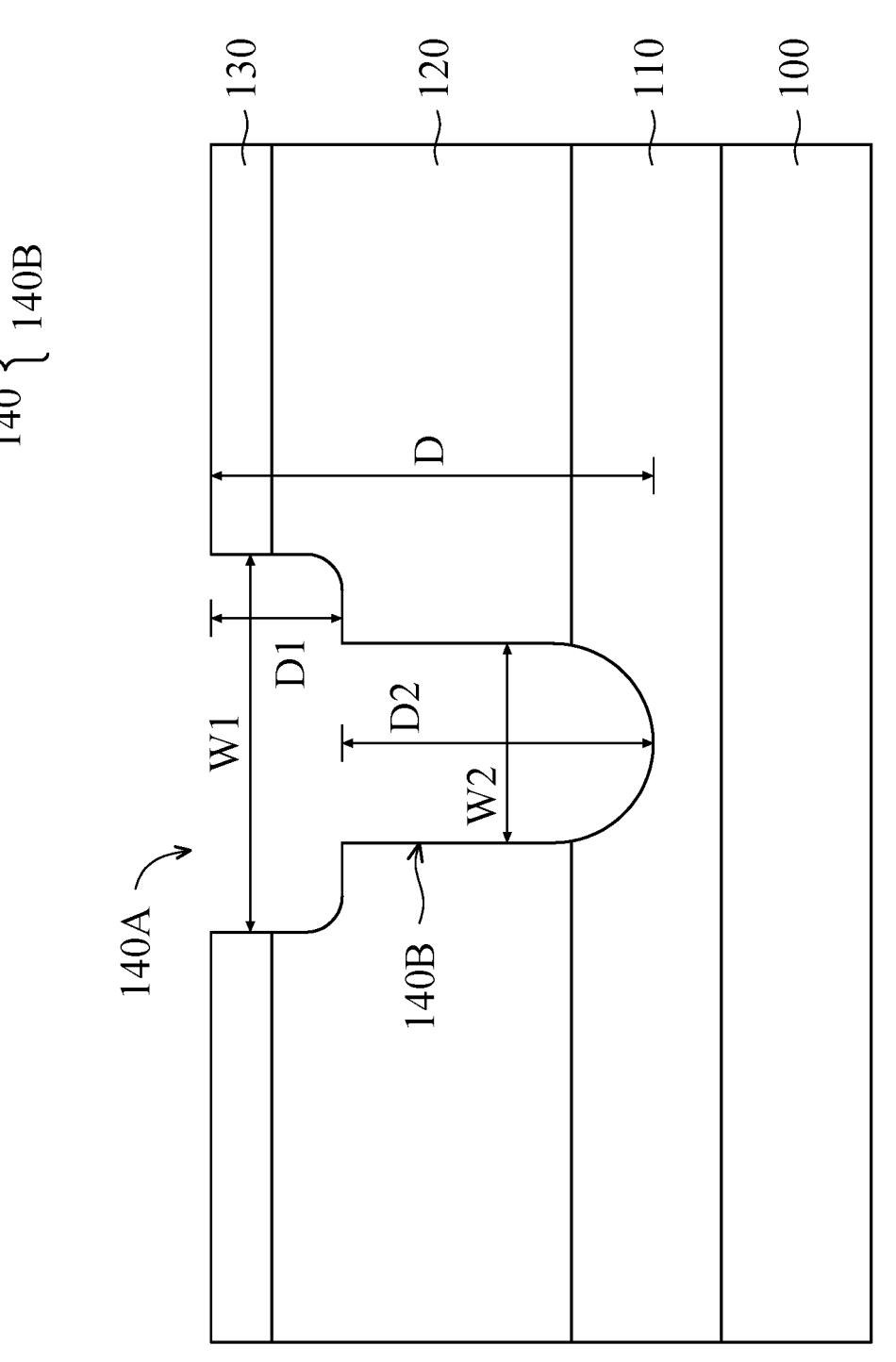

FIGS. 2D and 2E illustrate the formation of a gate trench 140, where the gate dielectric layer 150 and the gate electrode 160 are to be formed within. The gate trench 140 may include a first opening 140A and a second opening 140B. The second opening 140B is disposed below the first opening 140A.

Referring to FIG. 2D, the first opening 140A is initially formed through the well region 130, and it extends into the doped region 120. The first opening 140A has a first width W1 and a first depth D1. The first width W1 may be approximately between 0.6 μm and 1.4 μm, for example, approximately 0.95 μm. It should be noted that the first opening 140A of the present disclosure includes rounded corners, so the subsequently formed gate dielectric layer 150 and gate electrode 160 may adopt the profile, which generates less stress than using the profile with sharp corners. The first opening 140A may be formed by a lithography process, followed by an etching process. The lithography process may include resist coating, soft baking, exposure, post-exposure baking, development, the like, or combinations thereof. The etching process may include dry etching, wet etching, the like, or combinations thereof.

Referring to FIG. 2E, after forming the first opening 140A, the second opening 140B may be formed from the bottom surface of the first opening 140A. The second opening 140B is disposed vertically across the doped region 120 and the epitaxial layer 110. The second opening 140B has a second width W2 and a second depth D2. The second width W2 may be approximately between 0.2 μm and 0.9 μm, for example, approximately 0.55 μm. Similar to the feature of the first opening 140A, the second opening 140B includes rounded bottom. The formation of the second opening 140B may be similar to that of the first opening 140A, and the details are not described again herein to avoid repetition.

As shown in FIG. 2E, the gate trench 140 has a total depth D, which is approximately between 2.2 μm and 3.0 μm, for example, approximately 2.6 μm. According to some embodiments of the present disclosure, the first width W1 is approximately 1.5 to 2.0 times larger than the second width W2. The second depth D2 is approximately 4 to 6 times larger than the first depth D1. Even though the present embodiment illustrates forming the first opening 140A before forming the second opening 140B, it is not intended to be limiting. For example, an opening with the second width W2 and the total depth D may first be formed, followed by a recess to enlarge the upper portion of the opening to have the first width W1.

Figure 2F:
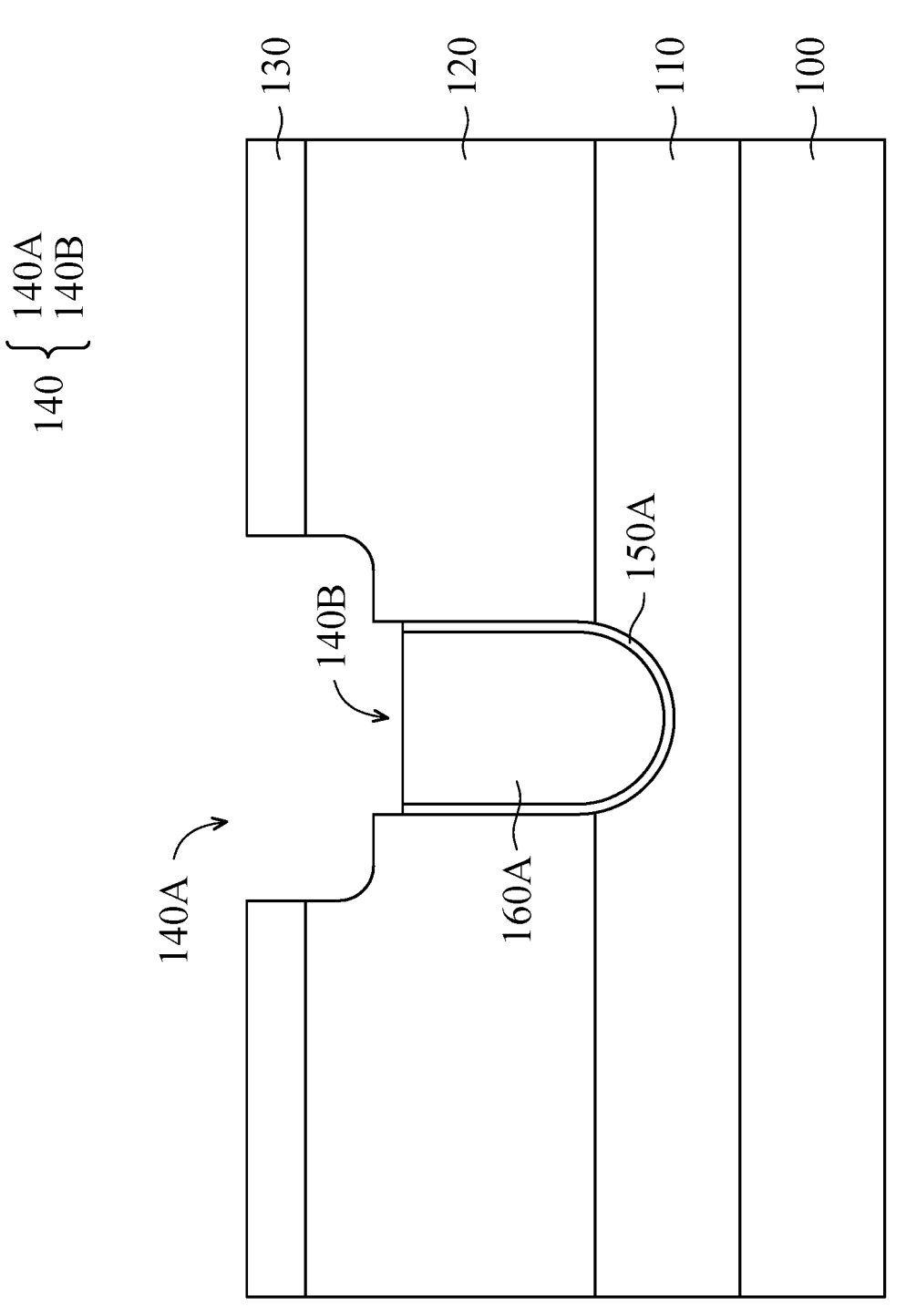
Figure 2G:
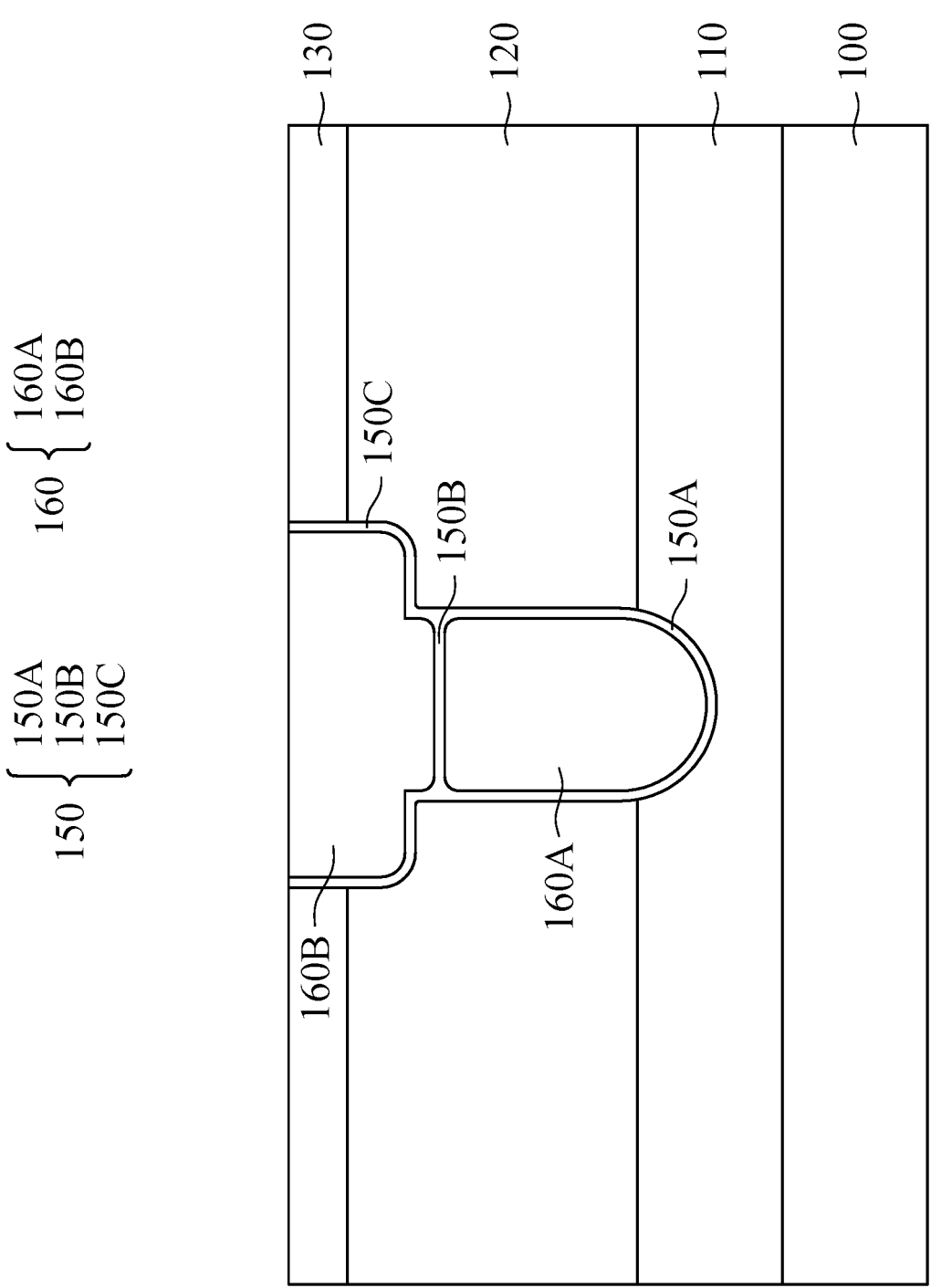

FIGS. 2F and 2G illustrate the formation of the gate dielectric layer 150 and the gate electrode 160, into the gate trench 140 having the previously defined profile. The gate dielectric layer 150 may be conformally deposited along the sidewall and the bottom of the gate trench 140, in order to insulate the gate electrode 160 from the doping layers (such as the epitaxial layer 110, the doped region 120, or the well region 130). The second opening 140B may be filled first, followed by the first opening 140A.

Referring to FIG. 2F, the first portion 150A of the gate dielectric layer 150 and the first structure 160A of the gate electrode 160 may be deposited in the second opening 140B of the gate trench 140. After performing the etching process to form the second opening 140B, a gate dielectric material and a gate electrode material may be sequentially filled into the second opening 140B prior to the removal of the lithography pattern. After the second opening 140B is filled, a planarization process (such as chemical mechanical polish or etch-back) may be performed to remove the lithography pattern and the excessive gate dielectric and gate electrode materials. According to some embodiments of the present disclosure, the gate dielectric material and the gate electrode material are further recessed below the top of the second opening 140B (or the joint between the first opening 140A and the second opening 140B). The remaining gate dielectric and gate electrode materials then become the first portion 150A of the gate dielectric layer 150 and the first structure 160A of the gate electrode 160, respectively. By making the top surfaces of the first portion 150A and the first structure 160A below the top of the second opening 140B, the subsequently formed second structure 160B may possess the protruding portion that is crucial to the present disclosure.

Referring to FIG. 2G, the second portion 150B and the third portion 150C of the gate dielectric layer 150 and the second structure 160B of the gate electrode 160 may be deposited in the remaining portion of the gate trench 140 (or more specifically, the remaining portion of the second opening 140B and the entire first opening 140A). The same gate dielectric material may be conformally formed on the sidewall of the first opening 140A, on the sidewall of the remaining portion of the second opening 140B, and on the top surfaces of the first portion 150A and the first structure 160A. After that, the same gate electrode material may completely fill up the gate trench 140. The same planarization process may be performed to remove the excessive gate dielectric and gate electrode materials outside the gate trench 140. After the planarization process, the top surfaces of the well region 130, the gate dielectric material, and the gate electrode material are level with each other. The segment of the gate dielectric material in contact with the top surfaces of the first portion 150A and the first structure 160A becomes the second portion 150B, while the rest of the gate dielectric material becomes the third portion 150C. The gate electrode material surrounded by the second portion 150B and the third portion 150C becomes the second structure 160B.

Figure 2H:
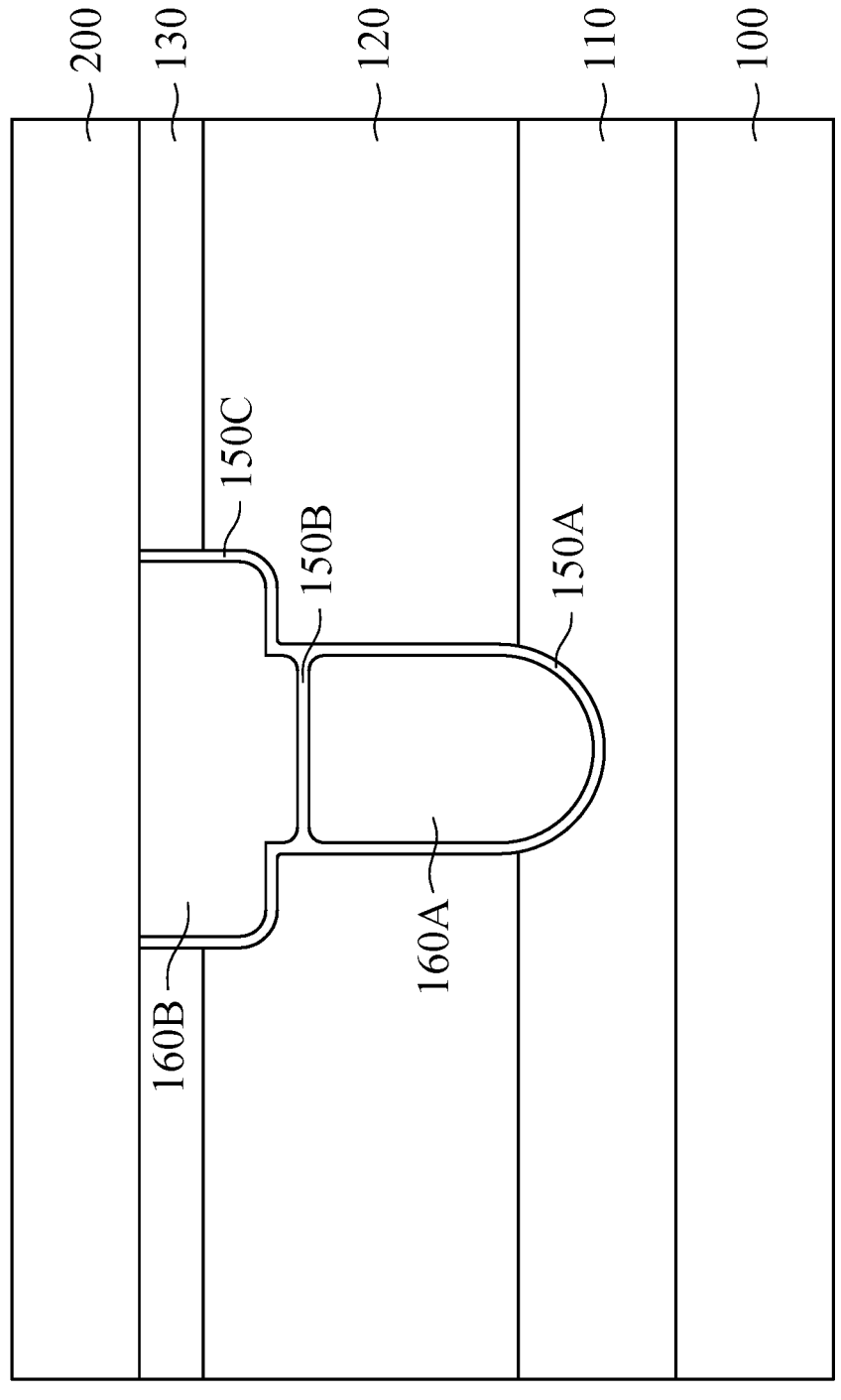

Referring to FIG. 2H, the interlayer dielectric layer 200 may be deposited on the well region 130, the gate dielectric layer 150, and the gate electrode 160. In some embodiments, the interlayer dielectric layer 200 seals off the gate trench 140. The gate electrode 160 may be separated from the overlying structures in order to prevent any potential short circuitry.

Figure 2I:
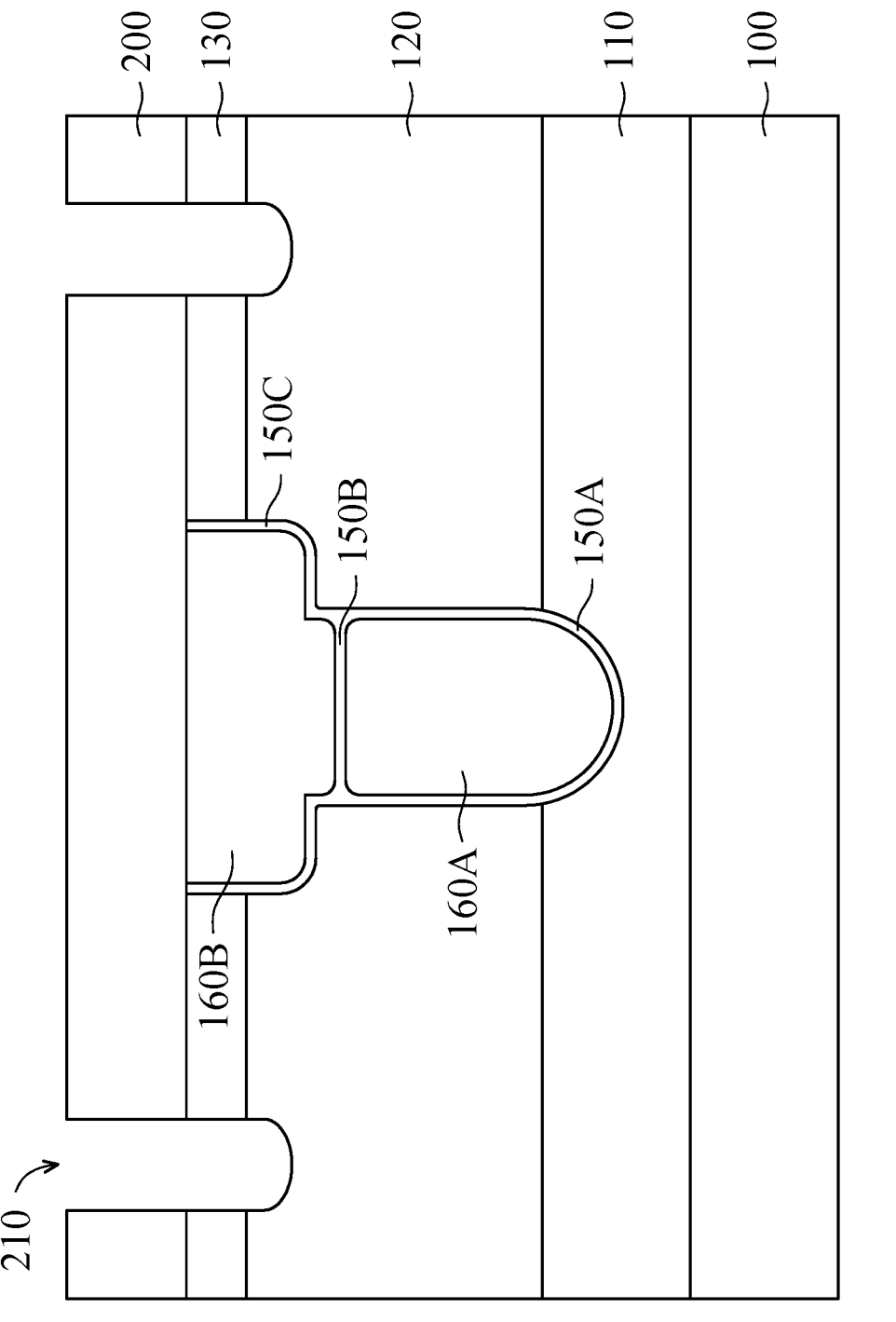

Referring to FIG. 2I, a pair of source trenches 210 are formed through the interlayer dielectric layer 200 and the well region 130, and they extend into the doped region 120. It should be noted that the source trenches 210 are laterally disposed on two opposite sides of the gate electrode 160. The gate electrode 160 may be laterally between the subsequently formed source electrodes 230.

Figure 2J:
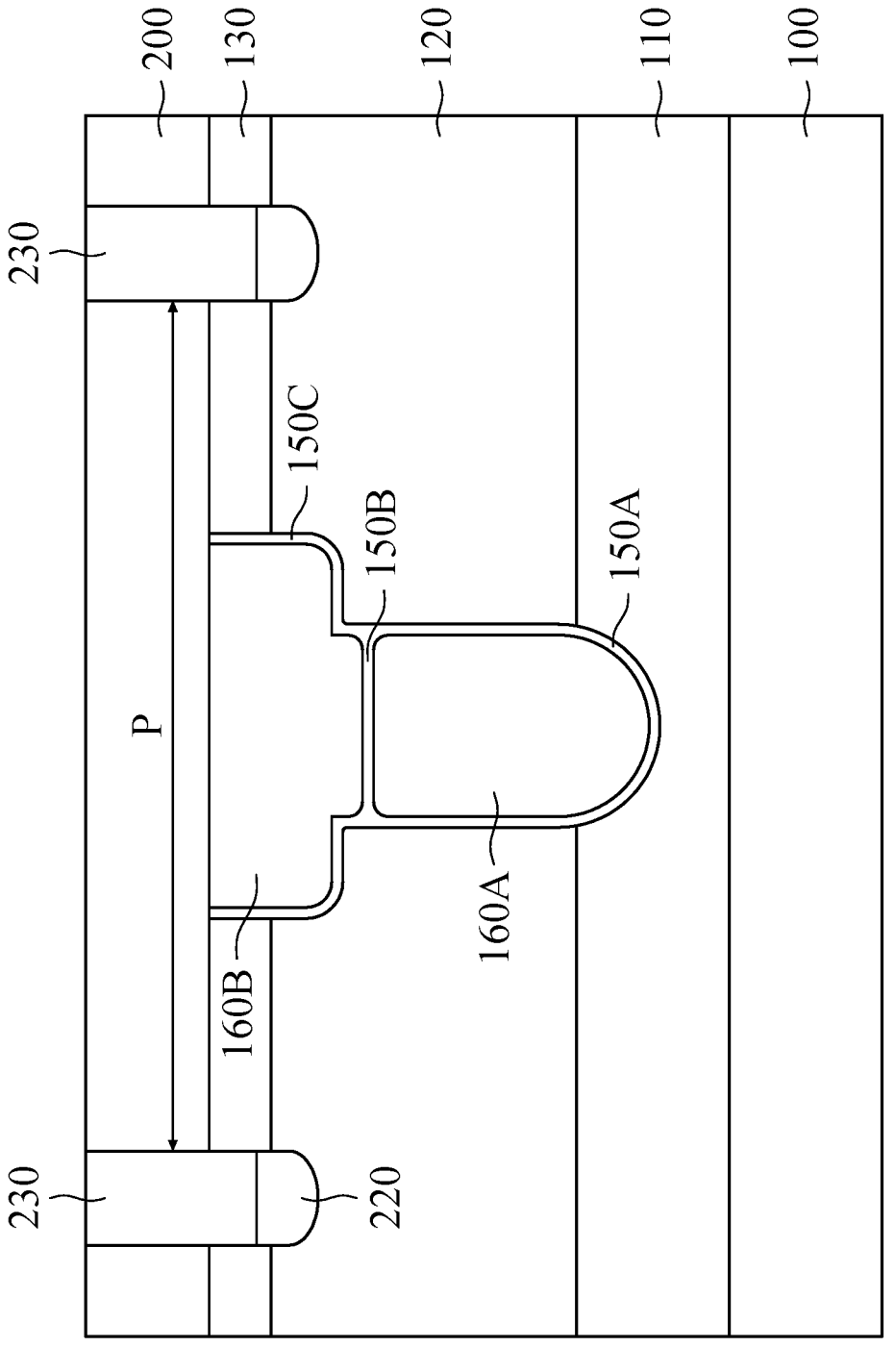

Referring to FIG. 2J, a contact material and a source electrode material may be sequentially filled into the source trenches 210. More specifically, the contact material may only fill the lower section of the source trenches 210, while the source electrode material may fill up the remaining section of the source trenches 210. The planarization process may be performed to remove the excessive source electrode material outside the source trenches 210. After the planarization process, the top surfaces of the interlayer dielectric layer 200 and the source electrode material are level with each other. The contact material becomes the doped contact regions 220, while the rest of the source electrode material becomes the source electrodes 230. The lateral distance between the neighboring source electrodes 230 may be defined as a pitch P of the semiconductor device 10.

Figure 2K:
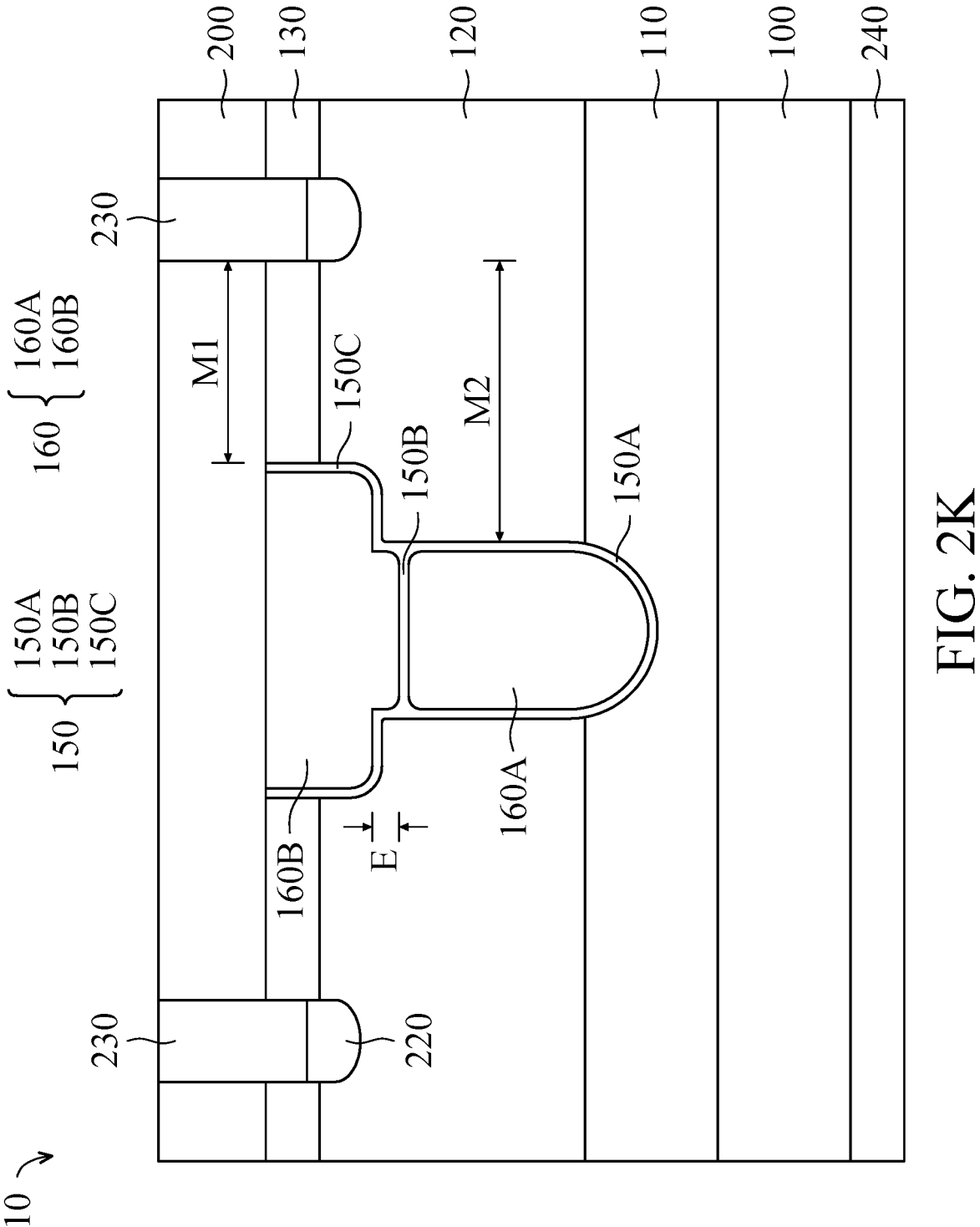

Referring to FIG. 2K, the drain electrode 240 may be formed on the backside of the substrate 100, thereby completing the semiconductor device 10 (or at least the active component thereof). In some embodiments, the drain electrode 240 covers the entire backside surface of the substrate 100, so the drain electrode 240 may be shared by every source electrode 230, where the vertical channel region can be generated.

The lateral distance between the gate electrode 160 and one of the source electrodes 230 may be defined as a mesa width. As shown in FIG. 2K, the gate electrode 160 is positioned at a direct center laterally between the pair of source electrodes 230. In other words, the mesa widths on either side the gate electrode 160 are the same, therefore a symmetrical behavior may be displayed. Because the gate electrode 160 of the present disclosure includes two structures of different dimensions, there are two different mesa widths. A first mesa width M1 defines the distance between the second structure 160B of the gate electrode 160 and one of the source electrodes 230, while a second mesa width M2 defines the distance between the first structure 160A of the gate electrode 160 and one of the source electrodes 230. As stated earlier, the gate electrode 160 is positioned at a direct center laterally between the pair of source electrodes 230, the first mesa width M1 or the second mesa width M2 on two opposite sides of the gate electrode 160 are symmetrical, thus having the same dimension on either side of the gate electrode 160.

In a specific embodiment, an exemplary device having the "split-gate" feature with the protruding portion is being compared with a conventional device having a single gate electrode of unifying dimension. The design features are listed and the electrical parameters are measured. The relevant data is summarized in Table 1.

35.96%. The threshold voltage has dropped by 23.04%, but the shifted value should still be acceptable to the industrial standard. Moreover, because the enhanced operation voltage, the saturated drain current has also been improved.

Even though an extra mask may be needed to fabricate the gate trench 140 of two different dimensions, the resulting device has demonstrated superior electrical performance. In the conventional design, the electric field may be concentrated near the bottom of the gate electrode. The "split-gate" feature of the innovative design may drive the electric field toward the drain terminal to enhance the breakdown voltage. The protruding portion of the gate structure of larger dimension can further suppress the on-resistance. With the features described, the semiconductor device 10 may successfully increase the breakdown voltage and decrease the on-resistance concurrently.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the

TABLE 1

| Design & Electrical Parameters | Conventional Design | Innovative Design | Variation |
|---|---|---|---|
| Epi Thickness | 6.0 μm | 6.0 μm | 0 |
| Gate Trench Depth | 2.60 μm | 2.60 μm | 0 |
| Trench 1st Width | N/A | 0.95 μm | N/A |
| Trench 2nd Width | 0.55 μm | 0.55 μm | 0 |
| 1st Mesa Width | N/A | 1.15 μm | N/A |
| 2nd Mesa Width | 1.35 μm | 1.35 μm | 0 |
| Pitch | 3.25 μm | 3.25 μm | 0 |
| Breakdown Voltage | 46.98 V | 59.10 V | +20.51% |
| On-Resistance | 4.06 m-ohm | 2.60 m-ohm | −35.96% |
| Threshold Voltage | 3.62 V | 2.79 V | −23.04% |
| Saturated Drain Current | $8.05 \times 10^{-6}$ A | $1.24 \times 10^{-5}$ A | +53.79% |

In order to make a valid comparison, parameters such as the Epi thickness, the gate trench depth, and the pitch will remain the same between the conventional design and the innovative design. Since the trench of the conventional design has only one single dimension, there can only be one trench width, hence one mesa width. It should be noted that the pitch equals the sum of twice the mesa width and the trench width. For the innovative design, the pitch equals the sum of twice the first mesa width and the trench 1st width (3.25 μm=2×1.15 μm+0.95 μm), or the sum of twice the second mesa width and the trench 2nd width (3.25 μm=2× 1.35 μm+0.55 μm).

In this specific embodiment, applying the "split-gate" feature with the protruding portion can increase the breakdown voltage by 20.51%, and decrease the on-resistance by present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor device, comprising:

a substrate having a first conductive type;

an epitaxial layer disposed on the substrate, wherein the epitaxial layer has the first conductive type;

a doped region disposed in the epitaxial layer, wherein the doped region has a second conductive type different from the first conductive type;

a gate electrode disposed through the doped region and extending into the epitaxial layer, wherein the gate electrode comprising:

a first structure having a first dimension; and a second structure above the first structure, wherein the second structure comprises a main portion and a protruding portion below the main portion, wherein the main portion has a second dimension larger than the first dimension, and the protruding portion has the first dimension, wherein a bottom surface of the protruding portion is lower than a bottommost surface of the main portion, wherein a lateral dimension of the main portion is larger than a maximum lateral dimension of the protruding portion, and a sidewall of the main portion and a sidewall of the protruding portion are discontinuous, wherein a portion of a bottom surface of the main portion close to the protruding portion is planar; and a gate dielectric layer disposed on the gate electrode, wherein a top of the gate dielectric layer and a top surface of the gate electrode are levelled, wherein the gate dielectric layer comprises a first portion disposed on opposite sides and a bottom of the first structure, and a second portion disposed on opposite sides of the second structure, wherein the first portion is entirely separated from the second portion in a vertical projection, wherein the first portion is disposed in a first opening of a gate trench, and the second portion is disposed in a second opening of the gate trench, wherein the first opening has a first width, and the second opening has a second width larger than the first width.

2. The semiconductor device of claim 1, wherein the gate dielectric layer further comprising:

a third portion disposed between the first structure and the protruding portion of the second structure.

3. The semiconductor device of claim 1, wherein the protruding portion of the second structure is vertically located between the first structure and the main portion of the second structure.

4. The semiconductor device of claim 1, further comprising a well region disposed in the doped region, wherein the well region has the first conductive type.

5. The semiconductor device of claim 4, wherein the main portion of the second structure of the gate electrode is disposed through the well region and extends into the doped region.

6. The semiconductor device of claim 1, wherein the protruding portion of the second structure of the gate electrode is entirely disposed in the doped region.

7. The semiconductor device of claim 1, wherein the first structure of the gate electrode is disposed across the doped region and the epitaxial layer.

8. The semiconductor device of claim 4, further comprising an interlayer dielectric (ILD) layer disposed on the epitaxial layer and the gate electrode.

9. The semiconductor device of claim 8, further comprising a source electrode disposed through the interlayer dielectric layer and extending into the well region.

10. The semiconductor device of claim 9, further comprising a doped contact region below the source electrode and extending into the doped region, wherein the doped contact region has the second conductive type.

11. The semiconductor device of claim 1, further comprising a drain electrode disposed on another side of the substrate opposite the epitaxial layer.

* * * * *